Sept. 28, 1965 R. H. BERGMAN 3,209,162

TUNNEL DIODE DEVICE

Filed June 20, 1961 2 Sheets-Sheet 1

INVENTOR.
RICHARD H. BERGMAN
BY
Carl V. Olson
ATTORNEY

INVENTOR.
RICHARD H. BERGMAN
BY
Carl V. Olson
ATTORNEY

United States Patent Office 3,209,162

Patented Sept. 28, 1965

3,209,162

TUNNEL DIODE DEVICE

Richard H. Bergman, Riverton, N.J., assignor to Radio Corporation of America, a corporation of Delaware Filed June 20, 1961, Ser. No. 118,418
3 Claims. (Cl. 307—88.5)

This invention relates to high speed monostable and bistable tunnel diode circuits.

Prior art tunnel diode circuits have usually been constructed to operate in a manner involving a straight resistive load line which intersects the tunnel diode characteristic at one or two points, to provide stable operation in one or both of the positive resistance regions of the tunnel diode characteristic curve. Such prior art circuits have limitations and disadvantages as regards speed of operation, sensitivity to bias voltage changes, variation in output pulse width in dependence on output loading conditions, extended recovery period following an output pulse during which the circuit in insensitive to re-triggering, and sensitivity to triggering by the leading edge of an input pulse and insensitivity to a voltage level following the leading edge of an input pulse.

It is desired that a circuit be as sensitive to input voltage levels as it is to the leading edges of input pulses. For example, a circuit intended to be triggered only upon the occurrence of two input pulses must be sensitive to the levels of the input signals because of the practical difficulty of insuring that the two input pulses will have simultaneous leading edges. If the circuit is level sensitive, it will be reliable in responding solely to two overlapping input pulses, at the time when overlap first occurs, regardless of the exact timing of the leading edges of the two pulses.

It is an object of this invention to provide an improved tunnel diode monostable circuit including means for reducing the time required for recovery of the circuit after it has been switched, whereby the circuit is capable of a higher pulse repetition rate.

It is another object to provide an improved tunnel diode circuit characterized by being relatively unaffected by changes in power supply voltage.

It is a further object to provide an improved tunnel diode circuit which is reliably switched in response to the exceeding of a threshold value by the input signal level, and wherein switching is substantially unaffected by the rate at which the input signal approaches and exceeds the threshold value.

It is still another object to provide an improved tunnel diode circuit providing the desired operating characteristics and constructed from readily available and proven circuit elements.

An example of a circuit according to the invention includes a tunnel diode, and a series circuit connected across the tunnel diode which includes an inductor, a rectifier such as a tunnel rectifier, and a voltage source. A current source is also provided for supplying a constant current to the tunnel diode to quiescently bias the tunnel diode at a point in the low-voltage positive-resistance region of its characteristic. The bias current source is preferably coupled to the tunnel diode through the inductor for the purpose of taking advantage of the current stabilizing effect of the inductor. The bias current source and the bias voltage source are selected to provide a stable quiescent operating point with the tunnel diode in the low-voltage positive-resistance region of its characteristic and with the tunnel rectifier in a point on the high-impedance portion of its characteristic. The bias voltage source is selected so that the tunnel rectifier characteristic intersects the negative resistance region of the tunnel diode characteristic when monostable operation is desired, and intersects the high voltage positive resistance region of the tunnel diode characteristic when bistable operation is desired. The invention is particularly useful where a circuit is desired which will be triggered by the combination of two input pulses.

These and other objects and aspects of the invention will be apparent to those skilled in the art from the following more detailed description taken in conjunction with the appended drawings, wherein.

Figures 1, 2, 3:
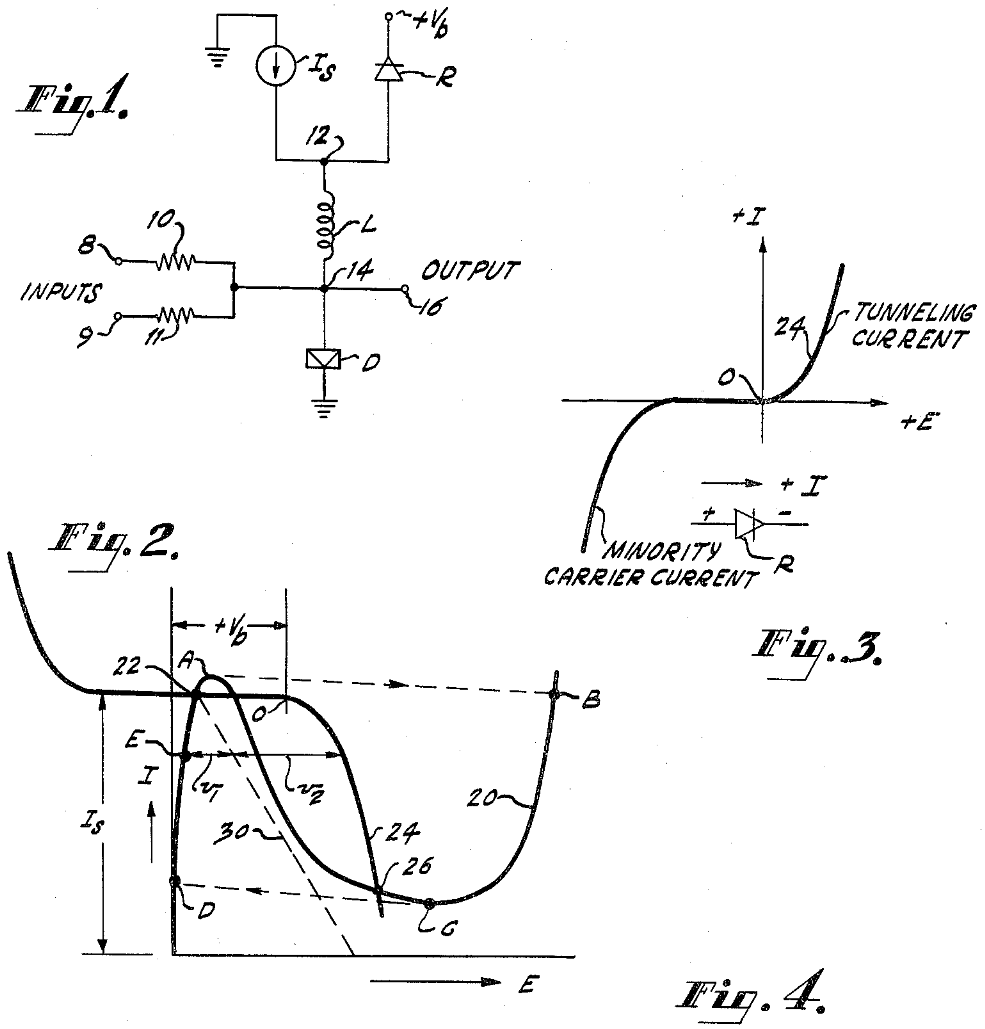
FIGURE 1 is a circuit diagram of a preferred form of a tunnel diode monostable circuit according to the invention.
FIGURE 2 is a current-voltage chart which will be referred to in describing the operation of the circuit of FIGURE 1.
FIGURE 3 is a current-voltage chart illustrating the tunnel rectifier convention employed in the circuit of FIGURE 1.

Reference will not be made in detail to the tunnel diode monostable circuit of FIGURE 1 which includes a tunnel diode D to which input trigger pulses or voltage levels are applied from input terminals 8 and 9 through input resistors 10 and 11. Alternatively, the input elements 10 and 11 may be suitable non-linear devices such as rectifiers. A series circuit including an inductor L, a rectifier R, which preferably is a tunnel rectifier, and a voltage source including a positive terminal $+V_b$, is connected across the tunnel diode D. The voltage source for connection to the $+V_b$ terminal is a constant voltage source which provides a voltage that is substantially unaffected by variations in the monostable circuit. The tunnel rectifier R serves to present a non-linear load to the tunnel diode for purposes which will be apparent as the description proceeds.

A bias-current source $I_s$ is connected to supply a substantially constant bias current through the inductor L to the tunnel diode D. The constant current source $I_s$ may be constructed by connecting a relatively high-voltage source through a relatively high resistance to the junction point 12. With such an arrangement, the current supplied to the tunnel diode D is determined primarily by the large resistor, and is substantially unaffected by changes in the resistance of the monostable circuit elements. The constant current source $I_s$ i preferably connected to the tunnel diode D through the inductor L for the purpose of taking advantage of the current stabilizing effect of the inductor L. The primary purpose of the inductor L is to determine the duration of the output pulse made available at the output terminal 16.

The operation of the circuit of FIGURE 1 will now be described with references to the current-voltage charts of FIGURES 2 and 3. FIGURE 2 shows the characteristic curve (all the curves are somewhat idealized) 20 of the tunnel diode D, the characteristic curve including a low-voltage positive-resistance region from the origin to the maximum A, an intermediate-voltage negative-resistance region from the maximum A to minimum C, and a high-voltage positive-resistance region beyond C. The bias current soure $I_s$ is selected to provide a value of bias current to statically or quiescently bias the tunnel diode at a stable point 22 in the low-voltage positive-resistance region of its characteristic curve.

FIGURE 3 shows the current-voltage characteristic 24 of the tunnel rectifier R illustrating the polarities and magnitudes of current and voltage in relation to the tunnel rectifier symbol R illustrated in this figure wherein positive voltage applied across the rectifier R causes a positive current I to flow in the direction of the arrowhead. The characteristic 24 includes a positive-current low-impedance tunneling current region to the right of the origin O, an intermediate high-impedance region, and a negative-current low-impedance minority carrier current region. Since the characteristic 24 of the rectifier R is employed in the circuit of FIGURE 1 as a non-linear load on the tunnel diode D, the characteristic curve 24, shown in FIGURE 2, may be rotated about the voltage axis and positioned in the chart of FIGURE 2 with the zero current or high-impedance portion of characteristic 24 positioned at the current level equal to $I_s$. The tunnel rectifier characteristic 24 is additionally positioned or displaced to the right, due to the effect of the bias voltage source $+V_b$, so that the origin O of the characteristic 24 is shifted to the right by the amount $+V_b$.

The values of the bias sources are selected so that the quiescent operating point 22 occurs at the intersection of the low-voltage positive-resistance region of the tunnel diode characteristic and the high-impedance region of the tunnel rectifier. The bias sources are selected so that the operating point 22 is the only stable operating point. Slated another way, the bias sources are selected so that the tunnel rectifier characteristic 24 does not intersect the high-voltage positive-resistance region of the tunnel diode characteristic 20. The intersection 26 falls in the negative-resistance region of the tunnel diode characteristic 24 and it is thus an unstable operating point.

The tunnel diode and tunnel rectifier are biased in a manner such as to utilize the high-impedance portion of the tunnel rectifier characteristic and the low-impedance tunneling current portion of the tunnel rectifier characteristic. Since only one of the low-impedance portions of the tunnel rectifier characteristic is utilized, the tunnel rectifier can be replaced by a conventional rectifier or diode provided that an appropriate adjustment is made in the value of the bias voltage $+V_b$. A tunnel rectifier is preferred over a conventional diode because the tunnel rectifier characteristic has a sharper break or knee between the high-impedance and low-impedance portions of its characteristic. It is also possible, as will be seen in connection with the circuit of FIGURE 5, to utilize the low-impedance minority carrier-current portion of the tunnel rectifier characteristic.

In the operation of the circuit of FIGURE 1, the operating point of the tunnel diode D is normally or quiescently at the operating point 22 in the chart of FIGURE 2. The current level $I_s$ of the operating point 22 is selected so that operation of the circuit is initiated by the application of an input pulse or input voltage level of predetermined magnitude to the input terminals 8 and 9. The input signal causes an increase in current through the tunnel diode D which takes the operating point up over the peak A of the characteristic 20, after which the operating point switches rapidly to a point such as the point B. Thereafter, the operating point moves down along the curve 20 to the valley point C. The time required for the current to decrease from the level at B to the level at C is determined primarily by the value of the inductor L. Therefore, the duration of the output voltage pulse is determined primarily by the value of the inductor L. When it is desired that the output pulses be of very short duration, the inductor L should provide a very small inductance, and the inductor L may be constituted by merely a short length of wire, or may be constituted merely by the inherent inductance of the contact tabs on the tunnel diode D. When the operating point reaches the point C it then switches rapidly to an operating point such as the point D, after which the circuit recovers more slowly as the operating point returns to the stable point 22.

The recovery time required for the operating point to return from the point D to the quiescently biased point 22 is shorter than can be achieved by prior art circuits employing a linear resistive load characteristic such as the characteristic 30. The speed at which the operating point moves from the point D to the point 22 depends on the varying voltage across the inductor L, which is the voltage difference between the operating point on the tunnel diode characteristic 20 and the voltage at the same current level on the load characteristic 24 or 30, as the case may be. When the operating point on the characteristic 24 is at the point E, a voltage $v_1$ is effective to restore the output voltage to its initial quiescent value when a linear resistive load line 30, according to the prior art, is employed. On the other hand, a voltage $v_1$ plus a voltage $v_2$ is effective when a non-linear impedance load line 24, according to the invention, is employed. This explain in a qualitative way the marked improvement or reduction in the recovery time obtained by following the teachings of this invention.

Another advantage of the circuit of FIGURE 1 is that the quiescent operating point 22 is relatively stable and unaffected by undesired changes in the bias voltage $+V_b$. Changes in the voltage $+V_b$ cause a lateral shifting of the characteristic 24, but this shifting does not result in a change in the current level of the quiescent operating point 22. By comparison, it is clear that a lateral shifting of the linear load line 30 causes a large change in the position of the quiescent operating point 22.

A further advantage of the circuit of FIGURE 1 is that it switches whenever the input signal level causes the current through the diode D to exceed the current peak at A. The circuit is as sensitive to the level of an input pulse as to the leading edge of the pulse. This is because both the leading edge current of an input pulse and the current level of the input pulse are equally directed to the path of tunnel diode D and are equally blocked from the path through L by the constant current source $I_s$ and the high impedance of the tunnel rectifier R. Sensitivity to input signal levels, rather than transients, is very important in circuits utilized in computer logic application, particularly where the circuit is to be triggered by the combined values of two inputs which generally do not appear simultaneously.

Figure 4:
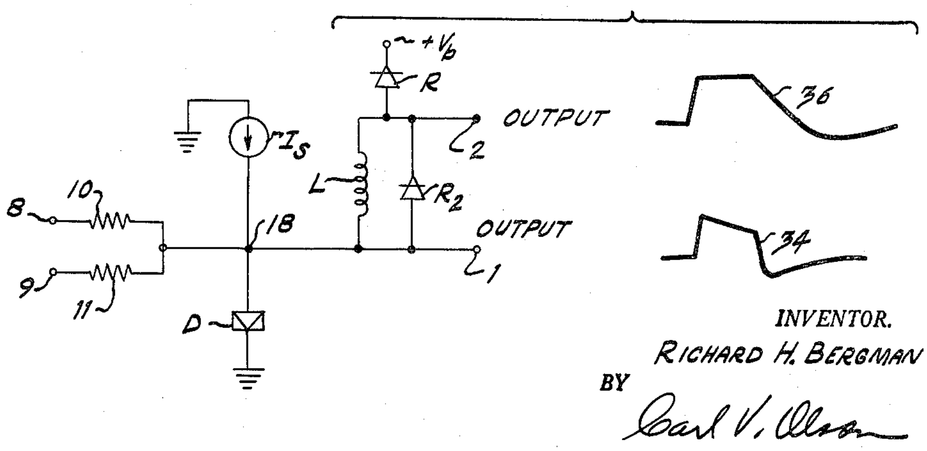
FIGURE 4 is a circuit diagram of another form of tunnel diode monostable circuit according to the invention.

FIGURE 4 shows a monostable tunnel diode circuit similar to the circuit of FIGURE 1 except that the current source $I_s$ is connected directly to the tunnel diode D, rather than through the inductor L, and except that an additional tunnel rectifier $R_2$ is connected across the inductor L. The circuit of FIGURE 4 has an output terminal 1 from which the output waveform 34 is available, and also an additional alternative output 2 from which the voltage waveform 36 is available. The waveform 36 differs from the waveform 34 in that it has a flat top, rather than a downwardly sloping top, and in that it has a less abrupt trailing edge. These characteristics result from the addition of the tunnel rectifier or conventional rectifier $R_2$ connected across the inductor L. In other respects, the operation of the circuit of FIGURE 4 is similar to the operation of the circuit of FIGURE 1.

Figure 5:
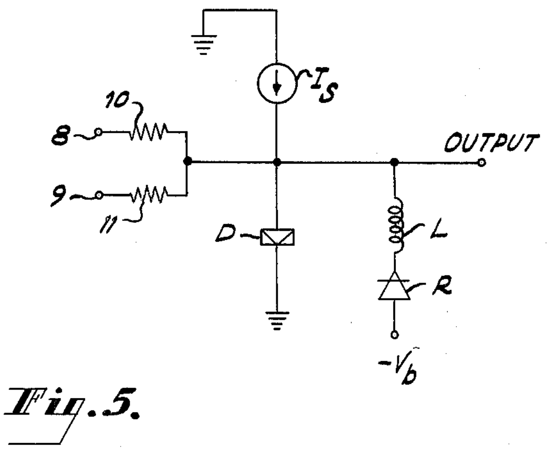
FIGURE 5 is a circuit diagram of still another form, involving reversed polarities, of a tunnel diode monostable circuit according to the invention.
Figure 7:
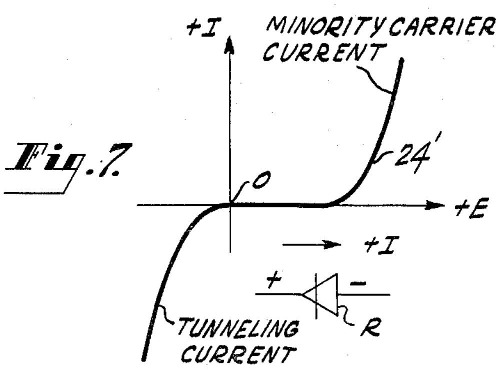
FIGURE 7 is a current-voltage chart illustrating the tunnel rectifier convention employed in the circuit of FIGURE 5.
Figure 6:
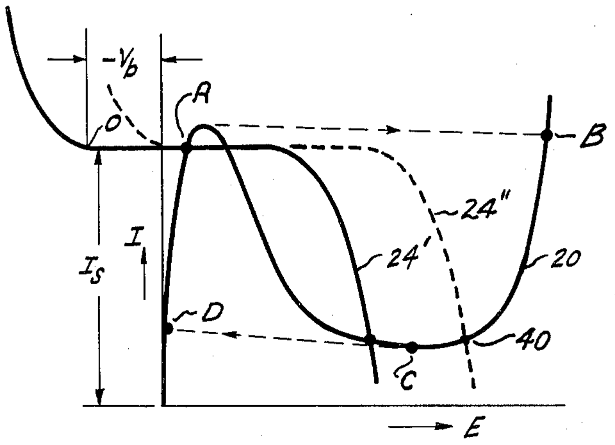
FIGURE 6 is a current-voltage chart which will be referred to in describing the operation of the circuit of FIGURE 5.

FIGURE 5 shows a tunnel diode monostable circuit similar to the circuit of FIGURE 1 and differing therefrom in that the rectifier R is connected in reversed polarity, and the bias voltage source connected thereto provides a negative voltage $-V_b$. In this arrangement, the minority-carrier-current, low-impedance portion of the tunnel rectifier characteristic is utilized, and the negative bias voltage $-V_b$ is selected to shift the rectifier characteristic 24' to the left in FIGURE 6 by an amount $-V_b$ on the voltage scale of the curent-voltage chart of FIGURE 6. FIGURE 7 shows the curent-voltage characteristic of the tunnel rectifier when a positive voltage is applied to the rectifier R to produce a positive current flow in a direction opposite to the direction of the arrowhead of the symbol.

It is possible to use either one of the two low-impedance portions of the tunnel rectifier characteristics because the two portions are quite similar and symmetrical. However, the utilization of the tunneling current portion of the tunnel rectifier characteristic, as illustrated in FIGURES 1 through 3, is preferred because in this case the operating point of the circuit does not involve the unstable, slightly negative-resistance portion of the tunnel rectifier characteristic which occurs near the minority-carrier-current portion of the tunnel rectifier characteristic.

The circuit of FIGURE 5 differs from the circuit of FIGURE 1 also in that the bias current source $I_s$ is supplied directly to the diode D rather than through the inductor L. It will be understood that the circuit of FIGURE 5 can just as well be arranged so that the bias current $I_s$ is supplied through the inductor L to the tunnel diode D. Except for the minor differences pointed out above, the circuit of FIGURE 5 is similar to, and operates substantially the same as, the circuit of FIGURE 1.

The circuits of FIGURES 1, 4 and 5 have been described as being biased for operation in a monostable manner, with only one stable operating condition. The circuits are also capable of operation in a bistable manner, with two stable operating conditions, by merely adjusting the value of the bias voltage source $+V_b$ or $-V_b$ as the case may be. For example, the circuit of FIGURE 5 may be adjusted for bistable operation by reducing the value of the bias source $-V_b$ so that the low impedance portion of the tunnel rectifier characteristic 24″ (FIGURE 6) intersects the high-voltage, positive resistance region of the tunnel diode characteristic 20 at the point 40. (The characteristics of the tunnel diode and the tunnel rectifier may be such that bistable operation results when the bias source $-V_b$ has a voltage value of zero.)

In bistable operation, the operating point switches from point A to point B and then to stable point 40 in response to a positive input signal which exceeds the threshold value. The operating point switches from point 40 through points C and D back to point A in response to a negative reset input pulse applied to the diode D, or in response to the trailing edge of the positive input pulse. In the resetting process, the tunnel rectifier is in a low impedance state, and the inductance L serves to momentarily isolate the constant voltage source $-V_b$ from the tunnel diode so that it is possible for the voltage across the tunnel diode, and the current therethrough, to be changed. If the inductance were not present (at least as distributed inductance), the constant voltage source $-V_b$ would make resetting of the tunnel diode difficult.

It is thus apparent that according to the present invention there are provided tunnel diode circuits which are characterized in providing improved performance as regards speed of operation, recovery time, input signal level sensitivity and stability against bias voltage changes.

What is claimed is:

1. A monostable tunnel diode circuit comprising a tunnel diode, a series circuit including an inductor, a tunnel rectifier and a bias voltage source, said series circuit being connected across said tunnel diode, means to couple a bias current source through said inductor to said tunnel diode to bias the diode in the low-voltage positive-resistance region of its characteristic, said bias sources being selected so that a stable quiescent operating condition is provided with the tunnel rectifier in a high-impedance state and the tunnel diode in a low-voltage state, means to apply trigger pulses to said tunnel diode to cause the operating condition of said tunnel diode to go through a reactive monostable cycle, and means to derive resulting output pulses from said tunnel diode.

2. A monostable tunnel diode circuit comprising a tunnel diode, a series circuit including an inductor, a tunnel rectifier and a bias voltage source, said series circuit being connected across said tunnel diode to constitute an on-linear load on said tunnel diode, means to couple a bias current source through said inductor to said tunnel diode to bias the diode in the low-voltage positive-resistance region of its characteristic, said bias sources being selected so that a stable operating condition is provided with the tunnel rectifier in its high-impedance state and the tunnel diode in a low-voltage state near the current peak of its characteristic curve from which it can easily be switched, means to apply trigger pulses to said tunnel diode to cause the operating condition to go through a reactive monostable cycle, and means to derive resulting output pulses from said tunnel diode.

3. A monostable tunnel diode circuit comprising a tunnel diode, means to couple a bias current source to said tunnel diode to bias the diode in the low-voltage positive-resistance region of its characteristic, a series circuit including an inductor, a first tunnel rectifier and a bias voltage source, said series circuit being connected across said tunnel diode to constitute a non-linear load on said tunnel diode, a second tunnel rectifier connected across said inductor, said bias sources being selected so that a stable operating condition is provided with said first tunnel rectifier in its high-impedance state and the tunnel diode in a low voltage state near the current peak of its characteristic curve from which it can easily be switched, and means to apply trigger pulses to said tunnel diode to cause the operating condition to go through a reactive monostable cycle, whereby resulting output pulses are available from said tunnel diode and from the junction between said tunnel rectifiers.

References Cited by the Examiner

UNITED STATES PATENTS

| | | | |
|---|---|---|---|
| 3,094,630 | 6/63 | Rapp et al. | 307—88.5 |
| 3,119,985 | 1/64 | Kaufman | 307—88.5 X |
| 3,133,206 | 5/64 | Bergman et al. | 307—88.5 |
| 3,142,767 | 7/64 | Cornish | 307—88.5 |

OTHER REFERENCES

International Solid-State Circuits Conference Digest of Technical Papers, Feb. 10, 1960, Session 1: Applications of Tunnel Diodes, 1.6 Esaki (Tunnel)-Diode Logic Circuits, G. W. Neff, S. A. Butter, and D. L. Critehlow, page 17, Fig. 3 relied upon.

JOHN W. HUCKERT, *Primary Examiner.*

HERMAN KARL SAALBACH, ARTHUR GAUSS, *Examiners.*